United States Patent
Hoshino

(10) Patent No.: US 12,422,753 B2
(45) Date of Patent: Sep. 23, 2025

(54) COPOLYMER, POSITIVE RESIST COMPOSITION, AND METHOD OF FORMING RESIST PATTERN

(71) Applicant: ZEON CORPORATION, Tokyo (JP)

(72) Inventor: Manabu Hoshino, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 457 days.

(21) Appl. No.: 17/998,927

(22) PCT Filed: Jun. 11, 2021

(86) PCT No.: PCT/JP2021/022376
§ 371 (c)(1),
(2) Date: Nov. 16, 2022

(87) PCT Pub. No.: WO2021/261297
PCT Pub. Date: Dec. 30, 2021

(65) Prior Publication Data
US 2023/0288805 A1   Sep. 14, 2023

(30) Foreign Application Priority Data
Jun. 22, 2020  (JP) .................................. 2020-107294

(51) Int. Cl.
*G03F 7/039* (2006.01)
*C08F 212/12* (2006.01)
*C08F 220/68* (2006.01)

(52) U.S. Cl.
CPC .......... *G03F 7/0397* (2013.01); *C08F 212/12* (2013.01); *C08F 220/68* (2013.01); *C08F 2800/10* (2013.01)

(58) Field of Classification Search
CPC .... G03F 7/0397; C08F 212/12; C08F 220/68; C08F 2800/10
See application file for complete search history.

(56) References Cited

U.S. PATENT DOCUMENTS

| | | | |
|---|---|---|---|
| 4,983,495 A | 1/1991 | Tsutsumi et al. | |
| 2021/0214481 A1 | 7/2021 | Hoshino | |
| 2023/0063003 A1* | 3/2023 | Hoshino | .................. G03F 7/38 |

FOREIGN PATENT DOCUMENTS

| | | | | |
|---|---|---|---|---|
| JP | 86449039 A | 2/1989 | | |
| JP | 2017119744 A | 7/2017 | | |
| JP | 2018154754 A | * 10/2018 | | |
| JP | 2020086063 A | 6/2020 | | |
| JP | 2021081657 A | * 5/2021 | | |
| WO | WO-2017130873 A1 | * 8/2017 | ............ | C08F 212/12 |
| WO | WO-2019077956 A1 | * 4/2019 | ............ | C08F 212/12 |
| WO | 2020066806 A1 | 4/2020 | | |

OTHER PUBLICATIONS

Aug. 17, 2021, International Search Report issued in the International Patent Application No. PCT/JP2021/022376.
Dec. 13, 2022, International Preliminary Report on Patentability issued in the International Patent Application No. PCT/JP2021/022376.

* cited by examiner

*Primary Examiner* — Mark F. Huff
*Assistant Examiner* — Christine Curiac
(74) *Attorney, Agent, or Firm* — KENJA IP LAW PC

(57) ABSTRACT

A copolymer includes a monomer unit (A) represented by formula (I), shown below, and a monomer unit (B) represented by formula (II), shown below, and has a weight-average molecular weight of 230,000 or more. In the formulae, L is a single bond or a divalent linking group, Ar is an optionally substituted aromatic ring group, $R^1$ is an alkyl group, $R^2$ is hydrogen, an alkyl group, a halogen atom, a haloalkyl group, a hydroxy group, a carboxy group, or a halocarboxy group, p is an integer of not less than 0 and not more than 5, and in a case in which more than one $R^2$ is present, each $R^2$ may be the same or different.

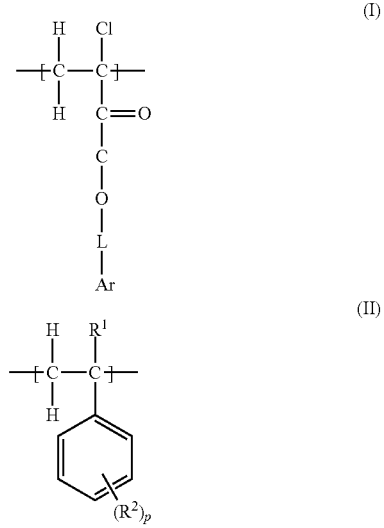

10 Claims, No Drawings

COPOLYMER, POSITIVE RESIST COMPOSITION, AND METHOD OF FORMING RESIST PATTERN

TECHNICAL FIELD

The present disclosure relates to a copolymer, a positive resist composition, and a method of forming a resist pattern, and, in particular, relates to a copolymer that can be suitably used as a positive resist, a positive resist composition that contains this copolymer, and a method of forming a resist pattern using this positive resist composition.

BACKGROUND

Polymers that undergo main chain scission to lower molecular weight upon irradiation with ionizing radiation, such as an electron beam, or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

As one example, Patent Literature (PTL) 1 discloses a copolymer that is formed using specific aromatic ring-containing monomers and that has a molecular weight distribution of 1.7 or less. Through the copolymer according to PTL 1, it is possible to form a resist pattern that has excellent heat resistance while also having excellent resolution and clarity. PTL 1 also discloses that the weight-average molecular weight of the specific copolymer described above can preferably be not less than 10,000 and not more than 80,000.

CITATION LIST

Patent Literature

PTL 1: WO2020/066806A1

SUMMARY

Technical Problem

However, there is room for improvement of a positive resist formed of the specific copolymer described in PTL 1 in terms of dry etching resistance. Moreover, demand for even finer resist patterns in recent years has been accompanied by demand for positive resists to enable formation of resist patterns having even better clarity. Furthermore, there has also been demand for inhibiting the occurrence of defects when forming a fine resist pattern using a positive resist.

Accordingly, one object of the present disclosure is to provide a copolymer that can be favorably used as a main chain scission-type positive resist capable of forming a resist pattern having excellent dry etching resistance and clarity while also having few defects, and also to provide a positive resist composition that contains this copolymer.

Another object of the present disclosure is to provide a method of forming a resist pattern by which it is possible to form a resist pattern having excellent dry etching resistance and clarity while also having few defects.

Solution to Problem

The inventor conducted diligent studies with the aim of achieving the object set forth above. The inventor discovered that through a positive resist formed of a copolymer that is formed using specific aromatic ring-containing monomers and that has a specific weight-average molecular weight, it is possible to form a resist pattern having excellent dry etching resistance and clarity while also having few defects, and, in this manner, completed the present disclosure.

Specifically, the present disclosure aims to advantageously solve the problems set forth above, and a presently disclosed copolymer comprises: a monomer unit (A) represented by formula (I), shown below,

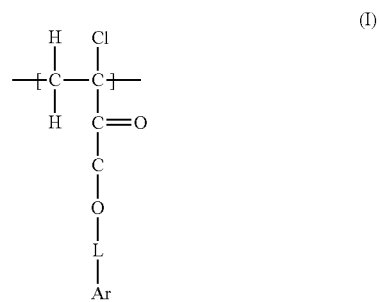

where, in formula (I), L is a single bond or a divalent linking group and Ar is an optionally substituted aromatic ring group; and a monomer unit (B) represented by formula (II), shown below,

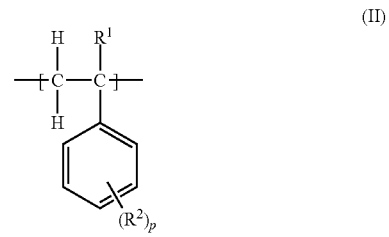

where, in formula (II), R1 is an alkyl group, $R^2$ is hydrogen, an alkyl group, a halogen atom, a haloalkyl group, a hydroxy group, a carboxy group, or a halocarboxy group, p is an integer of not less than 0 and not more than 5, and in a case in which more than one $R^2$ is present, each $R^2$ may be the same or different, wherein the copolymer has a weight-average molecular weight of 230,000 or more.

A copolymer that includes the monomer unit (A) and the monomer unit (B) set forth above can be favorably used as a main chain scission-type positive resist. Moreover, when the weight-average molecular weight of a copolymer including the monomer unit (A) and the monomer unit (B) is not less than the lower limit set forth above, it is possible to form a resist pattern having excellent dry etching resistance and clarity while also having few defects.

Note that the "weight-average molecular weight" referred to in the present specification can be measured as a standard polystyrene-equivalent value by gel permeation chromatography.

The presently disclosed copolymer preferably has a weight-average molecular weight of 280,000 or more. When the weight-average molecular weight of the specific copolymer is not less than the lower limit set forth above, it is possible to form a resist pattern having even better dry etching resistance and clarity while also having even fewer defects.

In the presently disclosed copolymer, a proportion of components having a molecular weight of less than 50,000 is preferably 20% or less. When the proportion of components having a molecular weight of less than 50,000 in the copolymer is 20% or less, it is possible to form a resist pattern having even better dry etching resistance and clarity while also having even fewer defects.

Note that the "proportion of components having a molecular weight of less than 50,000" referred to in the present disclosure can be determined by using a chromatogram obtained through gel permeation chromatography to calculate a proportion of the total area (B) of peaks for components having a molecular weight of less than 50,000 in the chromatogram relative to the total area (A) of peaks in the chromatogram (=(B/A)×100%). Note that the "molecular weight" in this case is a value based on the weight-average molecular weight of a standard substance (polystyrene in the EXAMPLES section of the present specification) used in preparation of the chromatogram.

In the presently disclosed copolymer, a proportion of components having a molecular weight of less than 100,000 is preferably 30% or less. When the proportion of components having a molecular weight of less than 100,000 in the copolymer is 30% or less, it is possible to form a resist pattern having even better dry etching resistance and clarity while also having even fewer defects.

Note that the "proportion of components having a molecular weight of less than 100,000" referred to in the present disclosure can be determined by using a chromatogram obtained through gel permeation chromatography to calculate a proportion of the total area (C) of peaks for components having a molecular weight of less than 100,000 in the chromatogram relative to the total area (A) of peaks in the chromatogram (=(C/A)×100%).

In the presently disclosed copolymer, a proportion of components having a molecular weight of more than 500,000 is preferably 10% or more. When the proportion of components having a molecular weight of more than 500,000 in the copolymer is 10% or more, it is possible to form a resist pattern having even better dry etching resistance and clarity while also having even fewer defects.

Note that the "proportion of components having a molecular weight of more than 500,000" referred to in the present disclosure can be determined by using a chromatogram obtained through gel permeation chromatography to calculate a proportion of the total area (D) of peaks for components having a molecular weight of more than 500,000 in the chromatogram relative to the total area (A) of peaks in the chromatogram (=(D/A)×100%).

In the presently disclosed copolymer, L is preferably a divalent linking group that includes an electron withdrawing group. This is because sensitivity to ionizing radiation or the like can be improved when L is a divalent linking group that includes an electron withdrawing group.

The electron withdrawing group of the presently disclosed copolymer is preferably at least one selected from the group consisting of a fluorine atom, a fluoroalkyl group, a cyano group, and a nitro group. This is because sensitivity to ionizing radiation or the like can be sufficiently improved when the electron withdrawing group is at least one selected from the group consisting of a fluorine atom, a fluoroalkyl group, a cyano group, and a nitro group.

For the presently disclosed copolymer, a difference between weight-average molecular weight $Mw^{20}$ thereof upon exposure with an electron beam irradiation dose of 20 $\mu C/cm^2$ and weight-average molecular weight $Mw^{40}$ thereof upon exposure with an electron beam irradiation dose of 40 $\mu C/cm^2$ is preferably 12,100 or more. When the difference between weight-average molecular weights upon exposure of the copolymer with the two electron beam irradiation doses set forth above is 12,100 or more, it is possible to form a resist pattern having even better clarity while also having even fewer defects.

Moreover, the present disclosure aims to advantageously solve the problems set forth above, and a presently disclosed positive resist composition comprises: any one of the copolymers set forth above; and a solvent. When the copolymer set forth above is contained as a positive resist, it is possible to form a resist pattern having excellent dry etching resistance and clarity while also having few defects.

Furthermore, the present disclosure aims to advantageously solve the problems set forth above, and a presently disclosed method of forming a resist pattern comprises: a step (A) of forming a resist film using the positive resist composition set forth above; a step (B) of exposing the resist film; and a step (C) of developing the resist film that has been exposed using a developer. By exposing and developing a resist film that has been formed using the positive resist composition set forth above, it is possible to form a resist pattern having excellent dry etching resistance and clarity while also having few defects.

In the presently disclosed method of forming a resist pattern, the developer preferably includes an alcohol. By using a developer that includes an alcohol to develop a resist film that has been formed using the positive resist composition set forth above, it is possible to form a resist pattern having even better clarity.

Advantageous Effect

Through the presently disclosed copolymer, it is possible to provide a main chain scission-type positive resist that is capable of forming a resist pattern having excellent dry etching resistance and clarity while also having few defects.

Moreover, through the presently disclosed positive resist composition and the presently disclosed method of forming a resist pattern in which this positive resist composition is used, it is possible to form a resist pattern having excellent dry etching resistance and clarity while also having few defects.

DETAILED DESCRIPTION

The following provides a detailed description of embodiments of the present disclosure.

Note that the term "optionally substituted" as used in the present disclosure means "unsubstituted or having one or more substituents".

The presently disclosed copolymer can be favorably used as a main chain scission-type positive resist that undergoes main chain scission to lower molecular weight upon irradiation with ionizing radiation, such as an electron beam, or short-wavelength light, such as ultraviolet light. Moreover, the presently disclosed positive resist composition contains the presently disclosed copolymer as a positive resist and can be used, for example, in formation of a resist pattern in a production process of a semiconductor, a photomask, a mold, or the like.

(Copolymer)

The presently disclosed copolymer includes: a monomer unit (A) represented by formula (I), shown below,

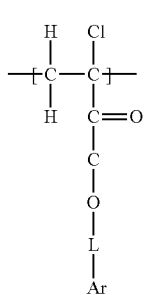

(I)

where, in formula (I), L is a single bond or a divalent linking group and Ar is an optionally substituted aromatic ring group; and a monomer unit (B) represented by formula (II), shown below,

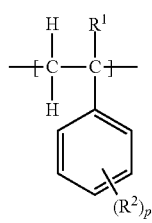

(II)

where, in formula (II), $R^1$ is an alkyl group, $R^2$ is hydrogen, an alkyl group, a halogen atom, a haloalkyl group, a hydroxy group, a carboxy group, or a halocarboxy group, p is an integer of not less than 0 and not more than 5, and in a case in which more than one $R^2$ is present, each $R^2$ may be the same or different. In addition, the presently disclosed copolymer has a weight-average molecular weight of 230,000 or more.

Note that although the presently disclosed copolymer may also include any monomer units other than the monomer unit (A) and the monomer unit (B), the proportion constituted by the monomer unit (A) and the monomer unit (B) among all monomer units of the copolymer is, in total, preferably 90 mol % or more, and more preferably 100 mol % (i.e., the copolymer more preferably only includes the monomer unit (A) and the monomer unit (B)).

As a result of including both the specific monomer unit (A) and the specific monomer unit (B), the presently disclosed copolymer readily undergoes main chain scission upon being irradiated with ionizing radiation or the like (i.e., the presently disclosed copolymer has high sensitivity to ionizing radiation or the like, such as an electron beam, a KrF laser, an ArF laser, or an EUV laser) and has excellent heat resistance compared to a homopolymer that only includes one of these monomer units, for example.

Moreover, the presently disclosed copolymer can form a resist pattern having excellent dry etching resistance and clarity while also having few defects as a result of having a weight-average molecular weight that is not less than the lower limit set forth above.

<Monomer Unit (A)>

The monomer unit (A) is a structural unit that is derived from a monomer (a) represented by formula (III), shown below.

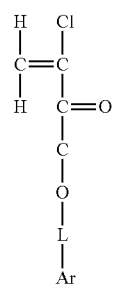

(III)

(In formula (III), L and Ar are the same as in formula (I).)

The proportion constituted by the monomer unit (A) among all monomer units of the copolymer is not specifically limited but can, for example, be set as not less than 30 mol % and not more than 70 mol %.

A divalent linking group that can constitute L in formula (I) and formula (III) is not specifically limited and may be an optionally substituted alkylene group, an optionally substituted alkenylene group, or the like, for example.

The alkylene group of the optionally substituted alkylene group is not specifically limited and may be a chain alkylene group such as a methylene group, an ethylene group, a propylene group, an n-butylene group, or an isobutylene group or a cyclic alkylene group such as a 1,4-cyclohexylene group, for example. Of these examples, the alkylene group is preferably a chain alkylene group having a carbon number of 1 to 6 such as a methylene group, an ethylene group, a propylene group, an n-butylene group, or an isobutylene group, more preferably a linear alkylene group having a carbon number of 1 to 6 such as a methylene group, an ethylene group, a propylene group, or an n-butylene group, and even more preferably a linear alkylene group having a carbon number of 1 to 3 such as a methylene group, an ethylene group, or a propylene group.

The alkenylene group of the optionally substituted alkenylene group is not specifically limited and may be a chain alkenylene group such as an ethenylene group, a 2-propenylene group, a 2-butenylene group, or a 3-butenylene group or a cyclic alkenylene group such as a cyclohexenylene group, for example. Of these examples, the alkenylene group is preferably a linear alkenylene group having a carbon number of 2 to 6 such as an ethenylene group, a 2-propenylene group, a 2-butenylene group, or a 3-butenylene group.

Of the examples given above, the divalent linking group is preferably an optionally substituted alkylene group from a viewpoint of sufficiently improving sensitivity to ionizing radiation or the like and heat resistance, with an optionally substituted chain alkylene group having a carbon number of 1 to 6 being more preferable, an optionally substituted linear alkylene group having a carbon number of 1 to 6 even more preferable, and an optionally substituted linear alkylene group having a carbon number of 1 to 3 particularly preferable.

Moreover, the divalent linking group that can constitute L in formula (I) and formula (III) preferably includes one or more electron withdrawing groups from a viewpoint of further improving sensitivity to ionizing radiation or the like. In particular, in a case in which the divalent linking group is an alkylene group that includes an electron withdrawing group as a substituent or an alkenylene group that includes an electron withdrawing group as a substituent, the electron withdrawing group is preferably bonded to a carbon that is bonded to the oxygen adjacent to the carbonyl carbon in formula (I) and formula (III).

Note that at least one selected from the group consisting of a fluorine atom, a fluoroalkyl group, a cyano group, and a nitro group may, for example, serve as an electron withdrawing group that can sufficiently improve sensitivity to ionizing radiation or the like without any specific limitations. The fluoroalkyl group is not specifically limited and may be a fluoroalkyl group having a carbon number of 1 to 5, for example. In particular, the fluoroalkyl group is preferably a perfluoroalkyl group having a carbon number of 1 to 5, and more preferably a trifluoromethyl group.

From a viewpoint of improving sensitivity to ionizing radiation or the like and dry etching resistance, L in formula (I) and formula (III) is preferably a methylene group, a cyanomethylene group, a trifluoromethylmethylene group, or a bis(trifluoromethyl)methylene group, and is more preferably a bis(trifluoromethyl)methylene group.

Ar in formula (I) and formula (III) may be an optionally substituted aromatic hydrocarbon ring group or an optionally substituted aromatic heterocyclic group.

The aromatic hydrocarbon ring group is not specifically limited and may be a benzene ring group, a biphenyl ring group, a naphthalene ring group, an azulene ring group, an anthracene ring group, a phenanthrene ring group, a pyrene ring group, a chrysene ring group, a naphthacene ring group, a triphenylene ring group, an o-terphenyl ring group, an m-terphenyl ring group, a p-terphenyl ring group, an acenaphthene ring group, a coronene ring group, a fluorene ring group, a fluoranthene ring group, a pentacene ring group, a perylene ring group, a pentaphene ring group, a picene ring group, a pyranthrene ring group, or the like, for example.

The aromatic heterocyclic group is not specifically limited and may be a furan ring group, a thiophene ring group, a pyridine ring group, a pyridazine ring group, a pyrimidine ring group, a pyrazine ring group, a triazine ring group, an oxadiazole ring group, a triazole ring group, an imidazole ring group, a pyrazole ring group, a thiazole ring group, an indole ring group, a benzimidazole ring group, a benzothiazole ring group, a benzoxazole ring group, a quinoxaline ring group, a quinazoline ring group, a phthalazine ring group, a benzofuran ring group, a dibenzofuran ring group, a benzothiophene ring group, a dibenzothiophene ring group, a carbazole ring group, or the like, for example.

Examples of possible substituents of Ar include, but are not specifically limited to, an alkyl group, a fluorine atom, and a fluoroalkyl group. Examples of alkyl groups that are possible substituents of Ar include chain alkyl groups having a carbon number of 1 to 6 such as a methyl group, an ethyl group, a propyl group, an n-butyl group, and an isobutyl group. Examples of fluoroalkyl groups that are possible substituents of Ar include fluoroalkyl groups having a carbon number of 1 to 5 such as a trifluoromethyl group, a trifluoroethyl group, and a pentafluoropropyl group.

Of the examples given above, Ar in formula (I) and formula (III) is preferably an optionally substituted aromatic hydrocarbon ring group from a viewpoint of improving sensitivity to ionizing radiation or the like and dry etching resistance, with an unsubstituted aromatic hydrocarbon ring group being more preferable, and a benzene ring group (phenyl group) even more preferable.

Moreover, from a viewpoint of improving sensitivity to ionizing radiation or the like and dry etching resistance, the monomer (a) represented by formula (III) described above that can form the monomer unit (A) represented by formula (I) described above is preferably benzyl a-chloroacrylate or 1-phenyl-1-trifluoromethyl-2,2,2-trifluoroethyl a-chloroacrylate, and more preferably 1-phenyl-1-trifluoromethyl-2,2,2-trifluoroethyl a-chloroacrylate. In other words, the copolymer preferably includes either or both of a 1-phenyl-1-trifluoromethyl-2,2,2-trifluoroethyl a-chloroacrylate unit and a benzyl a-chloroacrylate unit, and more preferably includes a 1-phenyl-1-trifluoromethyl-2,2,2-trifluoroethyl a-chloroacrylate unit.

<Monomer Unit (B)>

The monomer unit (B) is a structural unit that is derived from a monomer (b) represented by formula (IV), shown below.

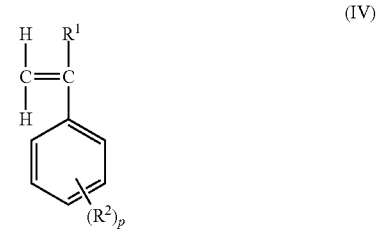

(IV)

(In formula (IV), $R^1$, $R^2$, and p are the same as in formula (II).)

The proportion constituted by the monomer unit (B) among all monomer units of the copolymer is not specifically limited but can, for example, be set as not less than 30 mol % and not more than 70 mol %.

Examples of alkyl groups that can constitute RI and $R^2$ in formula (II) and formula (IV) include, but are not specifically limited to, unsubstituted alkyl groups having a carbon number of 1 to 5. Of these examples, a methyl group or an ethyl group is preferable as an alkyl group that can constitute $R^1$ and $R^2$.

Examples of halogen atoms that can constitute $R^2$ in formula (II) and formula (IV) include, but are not specifically limited to, a fluorine atom, a chlorine atom, a bromine atom, and an iodine atom. Of these examples, a fluorine atom or a chlorine atom is preferable, and a chlorine atom is more preferable as the halogen atom.

Examples of haloalkyl groups that can constitute $R^2$ in formula (II) and formula (IV) include, but are not specifically limited to, fluoroalkyl groups having a carbon number of 1 to 5. Of these examples, a perfluoroalkyl group having a carbon number of 1 to 5 is preferable, and a trifluoromethyl group is more preferable as the haloalkyl group.

Examples of halocarboxy groups that can constitute $R^2$ in formula (II) and formula (IV) include, but are not specifically limited to, a monochlorocarboxy group, a dichlorocarboxy group, a trichlorocarboxy a group, a monofluorocarboxy group, difluorocarboxy group, and a trifluorocarboxy group. Of these examples, a trifluorocarboxy group is preferable as the halocarboxy group.

From a viewpoint of ease of production of the copolymer and improving main chain scission properties upon irradiation with ionizing radiation or the like, $R^1$ and $R^2$ in formula (II) and formula (IV) are preferably each an alkyl group having a carbon number of 1 to 5, and more preferably each a methyl group.

Moreover, from a viewpoint of ease of production of the copolymer and improving main chain scission properties upon irradiation with ionizing radiation or the like, p in formula (II) and formula (IV) is preferably 0 or 1.

Examples of the monomer (b) represented by formula (IV) described above that can form the monomer unit (B)

represented by formula (II) described above include, but are not specifically limited to, α-methylstyrene and derivatives thereof, such as (b-1) to (b-12), shown below.

(b-1)
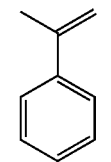

(b-2)
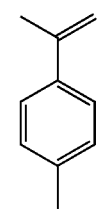

(b-3)
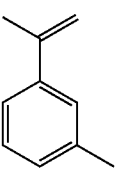

(b-4)
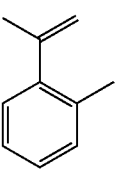

(b-5)
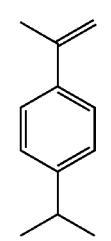

(b-6)
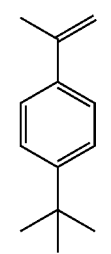

(b-7)
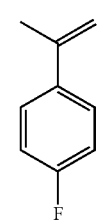

(b-8)
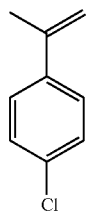

(b-9)
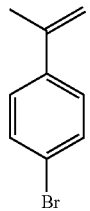

(b-10)
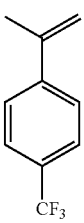

(b-11)
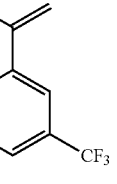

(b-12)
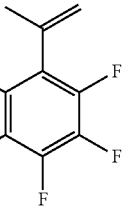

Note that the monomer unit (B) is preferably a structural unit derived from α-methylstyrene (b-1 above), 4-isopropenyltoluene (b-2 above), or 4-chloro-α-methylstyrene (b-8 above) from a viewpoint of ease of production of the copolymer and improving main chain scission properties upon irradiation with ionizing radiation or the like and dry etching resistance, and is more preferably a structural unit derived from α-methylstyrene from a viewpoint of further improving clarity and dry etching resistance of an obtained resist pattern. In other words, the copolymer preferably includes an α-methylstyrene unit from a viewpoint of further improving clarity and dry etching resistance of an obtained resist pattern.

<Properties of Copolymer>

The weight-average molecular weight of the copolymer is required to be 230,000 or more, and is preferably more than 230,000, more preferably more than 240,010, even more preferably 280,000 or more, and further preferably 300,000 or more. When the weight-average molecular weight is not less than any of the lower limits set forth above, it is possible to increase dry etching resistance and clarity of a resist pattern that is formed using the copolymer. Moreover, when the weight-average molecular weight is not less than any of the lower limits set forth above, connection of adjacent contact holes to each other is inhibited during formation of a contact hole pattern using the copolymer, which makes it possible to increase resist pattern formability. Note that a connection between adjacent contact holes can arise due to what is referred to as an "open defect", which occurs due to copolymer that is present in an unexposed section of a resist film dissolving in a developer. Furthermore, when the weight-average molecular weight is not less than any of the lower limits set forth above, it is possible to inhibit resist pattern top loss when the copolymer is used to form a fine resist pattern. Although no specific limitations are placed on an upper limit for the weight-average molecular weight of the copolymer, the weight-average molecular weight may be 900,000 or less, for example, from a viewpoint of ease of polymerization.

The number-average molecular weight of the copolymer is preferably 70,000 or more, more preferably 80,000 or more, even more preferably 100,000 or more, and further preferably 150,000 or more. When the number-average molecular weight of the copolymer is not less than any of the lower limits set forth above, dry etching resistance and clarity of an obtained resist pattern can be increased while also inhibiting the occurrence of connections between adjacent contact holes in an obtained resist pattern and resist pattern top loss. Although no specific limitations are placed on an upper limit for the number-average molecular weight of the copolymer, the number-average molecular weight may be 500,000 or less, for example, from a viewpoint of ease of polymerization.

Note that the "number-average molecular weight" referred to in the present specification can be measured as a standard polystyrene-equivalent value by gel permeation chromatography.

The molecular weight distribution of the copolymer is preferably 1.40 or more, and more preferably 1.45 or more, and is preferably 3.00 or less, and more preferably 2.50 or less. When the molecular weight distribution of the copolymer is not less than any of the lower limits set forth above, ease of polymer production can be increased. Moreover, when the molecular weight distribution of the copolymer is not more than any of the upper limits set forth above, clarity of an obtained resist pattern can be even further increased.

Note that the "molecular weight distribution" referred to in the present specification can be determined by calculating a ratio of the weight-average molecular weight relative to the number-average molecular weight (weight-average molecular weight/number-average molecular weight).

The proportion of components having a molecular weight of less than 50,000 in the copolymer is preferably 20% or less, more preferably 15% or less, even more preferably 10% or less, and further preferably 8% or less. Note that the copolymer may be free of components having a molecular weight of less than 50,000. When the proportion of components having a molecular weight of less than 50,000 in the copolymer is not more than any of the upper limits set forth above, it is possible to form a resist pattern having even better dry etching resistance and clarity while also having even fewer defects.

The proportion of components having a molecular weight of less than 100,000 in the copolymer is preferably 30% or less, more preferably 28% or less, even more preferably 25% or less, further preferably 20% or less, and particularly preferably 10% or less. Note that the copolymer may be free of components having a molecular weight of less than 100,000. When the proportion of components having a molecular weight of less than 100,000 in the copolymer is not more than any of the upper limits set forth above, it is possible to form a resist pattern having even better dry etching resistance and clarity while also having even fewer defects.

The proportion of components having a molecular weight of more than 500,000 in the copolymer is preferably 10% or more, more preferably 16% or more, and even more preferably 19% or more. When the proportion of components having a molecular weight of more than 500,000 in the copolymer is not less than any of the lower limits set forth above, it is possible to form a resist pattern having even better dry etching resistance and clarity while also having even fewer defects. Note that the proportion of components having a molecular weight of more than 500,000 in the copolymer can be 80% or less from a viewpoint of ease of production, but is not specifically limited thereto.

The difference between the weight-average molecular weight $Mw^{20}$ of the copolymer upon exposure with an electron beam irradiation dose of 20 $\mu C/cm^2$ and the weight-average molecular weight $Mw^{40}$ of the copolymer upon exposure with an electron beam irradiation dose of 40 $\mu C/cm^2$ is preferably 12,100 or more, more preferably 16,000 or more, and even more preferably 17,000 or more. When sensitivity of the copolymer to an electron beam satisfies any of the conditions set forth above, it is possible to form a resist pattern having even better clarity while also having even fewer defects. Although no specific limitations are placed on an upper limit for the difference between the weight-average molecular weight $Mw^{20}$ and the weight-average molecular weight $Mw^{40}$, the difference may be 30,000 or less, for example. When the difference between the weight-average molecular weight $Mw^{20}$ and the weight-average molecular weight $Mw^{40}$ is not less than any of the lower limits set forth above, this is thought to signify that the copolymer has extremely high sensitivity to an electron beam and undergoes molecular weight reduction at a high rate upon irradiation with an electron beam, thereby enabling targeting and reliable molecular weight reduction of copolymer present in an exposed section of a resist film. Therefore, a copolymer for which the difference between the weight-average molecular weight $Mw^{20}$ and the weight-average molecular weight $Mw^{40}$ is not less than any of the lower limits set forth above is thought to enable formation of a resist pattern having even better clarity and even fewer defects.

When the metal content in the copolymer is measured according to a method described in the EXAMPLES section, the potassium content is preferably 300 ppb or less, more preferably 200 ppb or less, and even more preferably 100 ppb or less, and the sodium content is preferably 1,000 ppb or less, more preferably 500 ppb or less, even more preferably 100 ppb or less, and further preferably 50 ppb or less. When the metal content in the copolymer is not more than any of the upper limits set forth above, it is possible to form a resist pattern having even better dry etching resistance and clarity while also having even fewer defects. By reducing the metal content in the copolymer, it is possible to suppress localized absorption of ionizing radiation, such as an electron beam, or short-wavelength light, such as ultraviolet light, in a resist that is formed of the copolymer. Consequently, it is possible to prevent pattern defects in a resist pattern formed using the copolymer by restricting the metal content in the copolymer to not more than any of the upper limits set forth above. Note that the copolymer may be free of metal. The metal content in the copolymer can be adjusted by adopting a specific method to purify a polymerized product that is obtained through polymerization of a monomer composition as described further below. Moreover, the metal content in the copolymer can be measured by a method described in the EXAMPLES section.
(Production Method of Copolymer)

The copolymer including the monomer unit (A) and the monomer unit (B) set forth above can be produced, for example, by carrying out polymerization of a monomer composition that contains the monomer (a) and the monomer (b), and then collecting and optionally purifying the resultant copolymer.

The chemical composition, molecular weight distribution, weight-average molecular weight, and number-average molecular weight of the copolymer can be adjusted by altering the polymerization conditions and the purification conditions. In one specific example, the weight-average molecular weight and the number-average molecular weight can be reduced by raising the polymerization temperature. In another specific example, the weight-average molecular weight and the number-average molecular weight can be reduced by shortening the polymerization time. Moreover, the molecular weight distribution can be reduced by performing purification.
<Polymerization of Monomer Composition>

The monomer composition used in production of the presently disclosed copolymer may be a mixture containing a monomer component that includes the monomer (a) and the monomer (b), an optional solvent, a polymerization initiator, and optionally added additives. Emulsion polymerization can be suitably adopted when polymerizing the monomer composition. Water is suitable as a solvent used when performing emulsion polymerization. Moreover, an anionic surfactant formed of an alkali salt of a higher fatty acid such as partially hydrogenated tallow fatty acid potassium soap can be suitably used as a surfactant used in emulsion polymerization. Also, a water-soluble initiator such as potassium persulfate can be suitably used as a polymerization initiator used in emulsion polymerization. It is also possible to optionally use a buffering agent such as sodium carbonate in the emulsion polymerization.

A polymerized product obtained through polymerization of the monomer composition may, without any specific limitations, be collected by adding a good solvent such as tetrahydrofuran to a solution containing the polymerized product and subsequently dripping the solution to which the good solvent has been added into a poor solvent such as methanol to coagulate the polymerized product.
<Purification of Polymerized Product>

The method of purification in a case in which the obtained polymerized product is purified may be, but is not specifically limited to, a known purification method such as reprecipitation or column chromatography. By performing purification by reprecipitation, column chromatography, or the like, it is possible to partially remove various metal components such as potassium and sodium that can become unavoidably mixed in due to reagents, synthesis vessels, and so forth used in production of the copolymer. Of these purification methods, reprecipitation is preferable from a viewpoint of ease.

Note that purification of the polymerized product may be performed repeatedly. Repeated purification makes it possible to further reduce the amounts of various metal components that can be contained in the copolymer.

Purification of the polymerized product by reprecipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to cause precipitation of a portion of the polymerized product. When purification is carried out by dripping a solution of the polymerized product into a mixed solvent of a good solvent and a poor solvent as described above, the molecular weight distribution, weight-average molecular weight, and number-average molecular weight of the resultant copolymer can easily be adjusted by altering the types and/or mixing ratio of the good solvent and the poor solvent. In one specific example, the molecular weight of copolymer that precipitates in the mixed solvent can be increased by increasing the proportion of the good solvent in the mixed solvent.

Also note that in a situation in which the polymerized product is purified by reprecipitation, polymerized product that precipitates in the mixed solvent of the good solvent and the poor solvent may be used as the presently disclosed copolymer, or polymerized product that does not precipitate in the mixed solvent (i.e., polymerized product dissolved in the mixed solvent) may be used as the presently disclosed copolymer, so long as the polymerized product that is used satisfies the desired properties. Polymerized product that does not precipitate in the mixed solvent can be collected from the mixed solvent by a known technique such as concentration to dryness.
(Positive Resist Composition)

The presently disclosed positive resist composition contains the copolymer set forth above and a solvent, and may optionally further contain known additives that can be contained in resist compositions. As a result of containing the copolymer set forth above as a positive resist, the presently disclosed positive resist composition can be suitably used to form a resist film and, when used to form a resist pattern, can form a resist pattern having excellent dry etching resistance and clarity.
<Solvent>

The solvent may be any solvent in which the copolymer set forth above is soluble without any specific limitations. For example, known solvents such as those described in JP5938536B1 can be used. Of such solvents, anisole, propylene glycol monomethyl ether acetate (PGMEA), cyclopentanone, cyclohexanone, or isoamyl acetate is preferably used as the solvent from a viewpoint of obtaining a positive resist composition having a suitable viscosity and improving coatability of the positive resist composition.
<Production of Positive Resist Composition>

The positive resist composition can be produced by mixing the copolymer set forth above, the solvent, and known additives that can optionally be used. The method of mixing is not specifically limited, and mixing may be performed by a commonly known method. Moreover, the positive resist composition may be produced by filtering the mixture after mixing of components.
{Filtration}

No specific limitations are placed on the method by which the mixture is filtered. For example, the mixture can be filtered using a filter. The filter is not specifically limited and may, for example, be a filtration membrane based on a fluorocarbon, cellulose, nylon, polyester, hydrocarbon, or the like. In particular, from a viewpoint of effectively preventing impurities such as metals from becoming mixed into the positive resist composition from metal piping or the like that may be used in production of the copolymer, the constituent material of the filter is preferably nylon, polyethylene, polypropylene, a polyfluorocarbon such as polytetrafluoroethylene or Teflon® (Teflon is a registered trademark in Japan, other countries, or both), tetrafluoroethyleneperfluoroalkyl vinyl ether copolymer (PFA), nylon, a composite membrane of polyethylene and nylon, or the like. For example, a filter disclosed in U.S. Pat. No. 6,103,122A may be used as the filter. Moreover, the filter may be a commercially available product such as Zeta Plus® 40Q (Zeta Plus is a registered trademark in Japan, other countries, or both) produced by CUNO Incorporated. Furthermore, the filter may be a filter that contains a strongly cationic or weakly cationic ion exchange resin. The average particle diameter of the ion exchange resin is not specifically limited but is preferably not less than 2 μm and not more than 10 μm. Examples of cation exchange resins that may be used include a sulfonated phenol-formaldehyde condensate, a sulfonated phenol-benzaldehyde condensate, a sulfonated styrene-divinylbenzene copolymer, a sulfonated methacrylic acid-divinylbenzene copolymer, and other types of sulfo or carboxy group-containing polymers. In the cation exchange resin, $H^+$ counter ions, $NH_4^+$ counter ions, or alkali metal counter ions such as $K^+$ or $Na^+$ counter ions are provided. The cation exchange resin preferably includes hydrogen counter ions. One example of such a cation exchange resin is Microlite® PrCH (Microlite is a registered trademark in Japan, other countries, or both) produced by Purolite, which is a sulfonated styrene-divinylbenzene copolymer including $H^+$ counter ions. Another example of such a cation exchange resin is commercially available as AMBERLYST® (AMBERLYST is a registered trademark in Japan, other countries, or both) produced by Rohm and Haas Company.

The pore diameter of the filter is preferably not less than 0.001 μm and not more than 1 μm. When the pore diameter of the filter is within the range set forth above, it is possible to sufficiently prevent impurities such as metals from being mixed into the positive resist composition.

(Method of Forming Resist Pattern)

The presently disclosed method of forming a resist pattern includes at least a step (resist film formation step) of forming a resist film using the presently disclosed positive resist composition set forth above, a step (exposure step) of exposing the resist film, and a step (development step) of developing the resist film that has been exposed using a developer. Moreover, the presently disclosed method of forming a resist pattern may further include a step (developer removal step) of removing the developer after the development step. Furthermore, the presently disclosed method of forming a resist pattern may further include a step (post exposure bake step) of heating the resist film that has been exposed between the exposure step and the development step.

In the presently disclosed method of producing a resist pattern, it is possible to form a resist pattern having excellent dry etching resistance as a result of using a positive resist composition that contains a specific copolymer as a positive resist.

(Resist Film Formation Step)

In the resist film formation step, the positive resist composition set forth above is applied onto a workpiece, such as a substrate, that is to be processed using a resist pattern (onto a lower layer film in a case in which a subsequently described lower layer film is formed), and the applied positive resist composition is dried to form a resist film. The substrate is not specifically limited and may, for example, be a substrate including an electrically insulating layer and copper foil on the electrically insulating layer that is used in production of a printed board or the like. The application method and the drying method of the positive resist composition can be methods that are typically used in the formation of a resist film without any specific limitations. In particular, the method of drying is preferably heating (prebaking). The prebaking temperature is preferably 100° C. or higher, more preferably 120° C. or higher, and even more preferably 140° C. or higher from a viewpoint of improving film density of the resist film, and is preferably 250° C. or lower, more preferably 220° C. or lower, and even more preferably 200° C. or lower from a viewpoint of reducing change of the molecular weight and molecular weight distribution of the copolymer in the resist film between before and after prebaking. Moreover, the prebaking time is preferably 10 seconds or more, more preferably 20 seconds or more, and even more preferably 30 seconds or more from a viewpoint of improving film density of the resist film formed through prebaking, and is preferably 10 minutes or less, more preferably 5 minutes or less, and more preferably 3 minutes or less from a viewpoint of reducing change of the molecular weight and molecular weight distribution of copolymer in the resist film between before and after prebaking.

—Substrate—

The substrate on which a resist film can be formed in the method of forming a resist pattern is not specifically limited and may, for example, be a mask blank including a light shielding layer formed on a substrate or a substrate including an electrically insulating layer and copper foil on the electrically insulating layer that is used in production of a printed board or the like.

The material of the substrate may be an inorganic material such as a metal (silicon, copper, chromium, iron, aluminum, etc.), glass, titanium oxide, silicon dioxide ($SiO_2$), silica, or mica; a nitride such as SiN; an oxynitride such as SiON; or an organic material such as acrylic, polystyrene, cellulose, cellulose acetate, or phenolic resin. Of these materials, a metal is preferable as the material of the substrate. The substrate may, for example, be a silicon substrate, a silicon dioxide substrate, or a copper substrate, and preferably a silicon substrate or a silicon dioxide substrate.

No specific limitations are placed on the size and shape of the substrate. Note that the surface of the substrate may be smooth or may have a curved or irregular shape, and that a substrate having a flake shape or the like may be used.

Moreover, the surface of the substrate may be subjected to surface treatment as necessary. For example, in the case of a substrate having hydroxy groups in a surface layer thereof, the substrate can be surface treated using a silane coupling agent that can react with hydroxy groups. This makes it possible to convert the surface layer of the substrate from hydrophilic to hydrophobic and to increase close adherence between the substrate and a subsequently described lower layer film or between the substrate and a resist film. The silane coupling agent is not specifically limited but is preferably hexamethyldisilazane.

A lower layer film formation step may optionally be performed in advance of the resist film formation step. In the lower layer film formation step, a lower layer film is formed on the substrate. Through provision of the lower layer film on the substrate, the surface of the substrate is hydrophobized. This can increase affinity of the substrate and a resist film and can increase close adherence between the substrate and the resist film. The lower layer film may be an inorganic lower layer film or an organic lower layer film.

An inorganic lower layer film can be formed by applying an inorganic material onto the substrate and then performing firing or the like of the inorganic material. The inorganic material may be a silicon-based material or the like, for example.

An organic lower layer film can be formed by applying an organic material onto the substrate to form a coating film and then drying the coating film. The organic material is not limited to being a material that is sensitive to light or an electron beam and may be a resist material or resin material that is typically used in the field of semiconductors or the field of liquid crystals, for example. In particular, the organic material is preferably a material that can form an organic lower layer film that can be etched, and particularly dry etched. By using such an organic material, it is possible to etch the organic lower layer film using a pattern formed through processing of a resist film, and to thereby transfer the pattern to the lower layer film and form a lower layer film pattern. In particular, the organic material is preferably a material that can form an organic lower layer film that can be etched by oxygen plasma etching or the like. For example, AL412 produced by Brewer Science, Inc. or the like may be used as an organic material that is used to form an organic lower layer film.

Application of the organic material described above can be performed by spin coating or a conventional and commonly known method using a spinner or the like. The method by which the coating film is dried may be any method that can cause volatilization of solvent contained in the organic material. For example, a method in which baking is performed or the like may be adopted. Although no specific limitations are placed on the baking conditions, the baking temperature is preferably not lower than 80° C. and not higher than 300° C., and more preferably not lower than 200° C. and not higher than 300° C. Moreover, the baking time is preferably 30 seconds or more, and more preferably 60 seconds or more, and is preferably 500 seconds or less, more preferably 400 seconds or less, even more preferably 300 seconds or less, and particularly preferably 180 seconds or less. Furthermore, the thickness of the lower layer film after drying of the coating film is not specifically limited but is preferably not less than 10 nm and not more than 100 nm.

(Exposure Step)

In the exposure step, the resist film formed in the resist film formation step is irradiated with ionizing radiation or light to write a desired pattern. Irradiation with ionizing radiation or light can be carried out using a known writing tool such as an electron beam lithography tool or a laser writer.

(Post Exposure Bake Step)

In the optionally performed post exposure bake step, the resist film that has been exposed in the exposure step is heated. By performing the post exposure bake step, it is possible to reduce the surface roughness of a resist pattern. Note that the clarity of a resist pattern significantly improves when a post exposure bake step is performed in the presently disclosed method of producing a resist pattern as a result of the previously described copolymer being used as a positive resist.

The heating temperature is preferably 85° C. or higher, and more preferably 90° C. or higher, and is preferably 160° C. or lower, more preferably 140° C. or lower, even more preferably 130° C. or lower, and particularly preferably 120° C. or lower. When the heating temperature is within any of the ranges set forth above, clarity of a resist pattern can be increased while also favorably reducing surface roughness of the resist pattern.

The time for which the resist film is heated (heating time) in the post exposure bake step is preferably 30 seconds or more, and more preferably 1 minute or more. When the heating time is 30 seconds or more, clarity of a resist pattern can be increased while also sufficiently reducing surface roughness of the resist pattern. On the other hand, the heating time is preferably 7 minutes or less, more preferably 6 minutes or less, and even more preferably 5 minutes or less, for example, from a viewpoint of production efficiency.

The method by which the resist film is heated in the post exposure bake step is not specifically limited and may, for example, be a method in which the resist film is heated by a hot plate, a method in which the resist film is heated in an oven, or a method in which hot air is blown against the resist film.

(Development Step)

In the development step, the resist film that has been exposed is developed using a developer to form a developed film on the workpiece.

Development of the resist film can be performed by bringing the resist film into contact with the developer, for example. The method by which the resist film and the developer are brought into contact may be, but is not specifically limited to, a method using a known technique such as immersion of the resist film in the developer or application of the developer onto the resist film.

<Developer>

The developer can be selected as appropriate depending on properties of the previously described copolymer, for example. Specifically, in selection of the developer, it is preferable to select a developer that does not dissolve a resist film prior to performing the exposure step but that can dissolve an exposed part of a resist film that has undergone the exposure step. One developer may be used individually, or two or more developers may be used as a mixture in a freely selected ratio.

Examples of developers that can be used include fluorinated solvents such as hydrofluorocarbons (1,1,1,2,3,4,4,5,5,5-decafluoropentane ($CF_3CFHCFHCF_2CF_3$), 1,1,1,2,2,3,3,4,4,5,5,6,6-tridecafluorohexane, 1,1,1,2,2,3,4,5,5,5-decafluoropentane, 1,1,1,3,3-pentafluorobutane, 1,1,1,2,2,3,3,4,4-nonafluorohexane, etc.), hydrochlorofluorocarbons (2,2-dichloro-1,1,1-trifluoroethane, 1,1-1,1-dichloro-2,2,3,3-pentafluoropropane dichloro-1-fluoroethane, ($CF_3CF_2CHCl_2$), 1,3-dichloro-1,1,2,2,3-pentafluoropropane ($CClF_2CF_2CHClF$), etc.), hydrofluoroethers (methyl nonafluorobutyl ether ($CF_3CF_2CF_2CF_2OCH_3$), methyl nonafluoroisobutyl ether, ethyl nonafluorobutyl ether ($CF_3CF_2CF_2CF_2OC_2H_5$), ethyl nonafluoroisobutyl ether, perfluorohexyl methyl ether ($CF_3CF_2CF(OCH_3)C_3F_7$), etc.), and perfluorocarbons ($CF_4$, $C_2F_6$, $C_3F_8$, $C_4F_8$, $C_4F_{10}$, $C_5F_{12}$, $C_6F_{12}$, $C_6F_{14}$, $C_7F_{14}$, $C_7F_{16}$, $C_8F_{18}$, $C_9F_{20}$, etc.); alcohols such as methanol, ethanol, 1-propanol, 2-propanol (isopropyl alcohol), 1-butanol, 2-butanol, 2-pentanol, and 3-pentanol; acetic acid esters including an alkyl group such as amyl acetate and hexyl acetate; mixtures of a fluorinated solvent and an alcohol; mixtures of a fluorinated solvent and an acetic acid ester including an alkyl group; mixtures of an alcohol and an acetic acid ester including an alkyl group; and mixtures of a fluorinated solvent, an alcohol, and an acetic acid ester including an alkyl group. In particular, from a viewpoint of improving clarity of an obtained resist pattern, it is preferable that the developer includes an alcohol, more preferable that the developer is an alcohol, and even more preferable that the developer is 2-butanol or isopropyl alcohol.

The temperature of the developer during development is not specifically limited and can be set as not lower than 21° C. and not higher than 25° C., for example. The development time can be set as not less than 30 seconds and not more than 4 minutes, for example.

(Developer Removal Step)

In the presently disclosed method of forming a resist pattern, a step of removing the developer can be performed after the development step. Removal of the developer can be performed by air blowing using a gas such as nitrogen or by rinsing treatment using a rinsing liquid.

(Etching Step)

In the etching step that can optionally be performed, the lower layer film and/or the substrate are etched using the resist pattern described above as a mask, and a pattern is formed in the lower layer film and/or the substrate.

The number of repetitions of etching is not specifically limited and may be once or a plurality of times. Moreover, the etching may be dry etching or wet etching, but is preferably dry etching. The dry etching can be performed using a commonly known dry etching apparatus. An etching gas that is used in the dry etching can be selected as appropriate depending on the element composition of the lower layer film or substrate that is to be etched, for example. Examples of etching gases that may be used include fluorine-based gases such as $CHF_3$, $CF_4$, $C_2F_6$, $C_3F_8$, and $SF_6$; chlorine-based gases such as $Cl_2$ and $BCl_3$; oxygen-based gases such as $O_2$, $O_3$, and $H_2O$; reducing gases such as $H_2$, $NH_3$, CO, $CO_2$, $CH_4$, $C_2H_2$, $C_2H_4$, $C_2H_6$, $C_3H_4$, $C_3H_6$, $C_3H_8$, HF, HI, HBr, HCl, NO, $NH_3$, and $BCl_3$; and inert gases such as He, $N_2$, and Ar. One of these gases may be used individually, or two or more of these gases may be used as a mixture. Note that dry etching of an inorganic lower layer film is usually performed using an oxygen-based gas. Moreover, dry etching of a substrate is normally performed using a fluorine-based gas and may suitably be performed using a mixture of a fluorine-based gas and an inert gas.

Lower layer film remaining on the substrate may be removed before etching of the substrate or after etching of the substrate as necessary. In a case in which the lower layer film is removed before etching of the substrate is performed, this lower layer film may be a lower layer film in which a pattern is formed or may be a lower layer film in which a pattern is not formed.

The method by which the lower layer film is removed may, for example, be dry etching such as described above. In the case of an inorganic lower layer film, the lower layer film may be removed by bringing a liquid such as a basic liquid or an acidic liquid, and preferably a basic liquid, into contact with the lower layer film. The basic liquid is not specifically limited and may be alkaline hydrogen peroxide aqueous solution or the like, for example. The method by which the lower layer film is removed through wet stripping using alkaline hydrogen peroxide aqueous solution is not specifically limited so long as it is a method in which the lower layer film and alkaline hydrogen peroxide aqueous solution can be brought into contact under heated conditions for a specific time and may, for example, be a method in which the lower layer film is immersed in heated alkaline hydrogen peroxide aqueous solution, a method in which alkaline hydrogen peroxide aqueous solution is sprayed against the lower layer film in a heated environment, or a method in which heated alkaline hydrogen peroxide aqueous solution is applied onto the lower layer film. After any of these methods is performed, the substrate may be washed with water and then dried to thereby obtain a substrate from which the lower layer film has been removed.

The following describes an example of the presently disclosed method of forming a resist pattern using a positive resist and also of a method of etching a lower layer film and a substrate using the resist pattern that is formed. Note that the substrate, conditions in each step, and so forth that are adopted in the following example can be the same as the substrate, conditions in each step, and so forth that were previously described, and thus description thereof is omitted below. It should be noted that the presently disclosed method of forming a resist pattern is not limited to the method given in the following example.

One example of the method of forming a resist pattern is a method of forming a resist pattern using an electron beam or EUV that includes the previously described lower layer film formation step, resist film formation step, exposure step, development step, and rinsing step. Moreover, one example of the etching method is a method in which a resist pattern formed by the method of forming a resist pattern is used as a mask and that includes an etching step.

Specifically, in the lower layer film formation step, an inorganic material is applied onto a substrate and is fired to form an inorganic lower layer film.

Next, in the resist film formation step, the presently disclosed positive resist composition is applied onto the inorganic lower layer film that has been formed in the lower layer film formation step and is dried to form a resist film.

The resist film that is formed in the resist film formation step is then irradiated with EUV in the exposure step so as to write a desired pattern.

Moreover, in the development step, the resist film that has been exposed in the exposure step and a developer are brought into contact to develop the resist film and form a resist pattern on the lower layer film.

In the rinsing step, the resist film that has been developed in the development step and a rinsing liquid are brought into contact to rinse the developed resist film.

In the etching step, the resist pattern is used as a mask to etch the lower layer film and thereby form a pattern in the lower layer film.

The lower layer film in which the pattern has been formed is then used as a mask to etch the substrate and thereby form a pattern in the substrate.

EXAMPLES

The following provides a more specific description of the present disclosure based on examples. However, the present disclosure is not limited to the following examples.

In the examples and comparative examples, the following methods were used to measure and evaluate various attributes of an obtained copolymer.

<Weight-Average Molecular Weight, Number-Average Molecular Weight, and Molecular Weight Distribution>

The weight-average molecular weight (Mw) and number-average molecular weight (Mn) of an obtained copolymer were measured by gel permeation chromatography, and then the molecular weight distribution (Mw/Mn) of the copolymer was calculated.

Specifically, the weight-average molecular weight (Mw) and number-average molecular weight (Mn) of the copolymer were determined as standard polystyrene-equivalent values with tetrahydrofuran as an eluent solvent using a gel permeation chromatograph (HLC-8220 produced by Tosoh Corporation). The molecular weight distribution (Mw/Mn) was then calculated.

<Proportions of Components Having Various Molecular Weights in Copolymer>

A gel permeation chromatograph (HLC-8220 produced by Tosoh Corporation) was used to obtain a chromatogram of a copolymer with tetrahydrofuran as an eluent solvent. Molecular weight in the chromatogram was based on the weight-average molecular weight of standard polystyrene. The total area (A) of peaks, the total area (B) of peaks for components having a molecular weight of less than 50,000, the total area (C) of peaks for components having a molecular weight of less than 100,000, and the total area (D) of peaks for components having a molecular weight of more than 500,000 were determined from the obtained chromatogram.

The proportions of components having various molecular weights were calculated using the following formulae.

Proportion of components having molecular weight
of less than 50,000(%)=(B/A)×100

Proportion of components having molecular weight
of less than 100,000(%)=(C/A)×100

Proportion of components having molecular weight
of more than 500,000(%)=(D/A)×100

<Weight-Average Molecular Weight after Electron Beam Irradiation and Molecular Weight Difference ($Mw^{20}$-$Mw^{40}$)>

A spin coater (MS-A150 produced by Mikasa Co., Ltd.) was used to apply a positive resist composition (copolymer concentration: 8 mass %) produced in each example or comparative example onto a silicon wafer of 4 inches in diameter such as to have a thickness of 500 nm. The applied positive resist composition was heated for 5 minutes by a hot plate having a temperature of 160° C. to form a resist film on the silicon wafer. The formed resist film was taken to be a sample, and the entire surface of each sample was subjected to total exposure with an electron beam under vacuum with conditions of an accelerating voltage of 50 kV and an irradiation dose of 20 µC/cm² or 40 µC/cm² using a lithography tool (EB ENGINE produced by Hamamatsu Photonics K.K.). Gel permeation chromatography was performed under the following conditions with respect to the resist film after irradiation in order to calculate the weight-average molecular weight $Mw^{20}$ upon exposure with an electron beam irradiation dose of 20 µC/cm² and the weight-average molecular weight $Mw^{40}$ upon exposure with an electron beam irradiation dose of 40 µC/cm². In this gel permeation chromatography, the weight-average molecular weight (Mw) was determined as a standard polystyrene-equivalent value with tetrahydrofuran as an eluent solvent using a gel permeation chromatograph (HLC-8220 produced by Tosoh Corporation).

The difference between the weight-average molecular weight $Mw^{20}$ upon exposure with an electron beam irradiation dose of 20 µC/cm² and the weight-average molecular weight $Mw^{40}$ upon exposure with an electron beam irradiation dose of 40 µC/cm² was then calculated.

<Metal Content of Copolymer>

An isoamyl acetate solution having a copolymer concentration of 1.5% that was produced using a copolymer obtained in each example or comparative example was heated on a heater equipped with a hood, and, once the sample was dry, ashing was performed in an electric furnace. After cooling, ash content was completely dissolved in acid to obtain a test solution, and this test solution was appropriately diluted and then measured by an ICP mass spectrometer (Agilent 7900 ICP-MS produced by Agilent Technologies, Inc.). Note that an absolute calibration method was adopted for a calibration curve and that a cool mode was adopted as the measurement mode.

<Sensitivity and γ Value>

A spin coater (MS-A150 produced by Mikasa Co., Ltd.) was used to apply a positive resist composition (copolymer concentration: 8 mass %) produced in each example or comparative example onto a silicon wafer of 4 inches in diameter such as to have a thickness of 500 nm. The applied positive resist composition was heated for 5 minutes by a hot plate having a temperature of 160° C. to form a resist film on the silicon wafer. An electron beam lithography tool (ELS-S50 produced by Elionix Inc.) was used to write a plurality of patterns (dimensions: 500 µm×500 µm) over the resist film with different electron beam irradiation doses, and development treatment was carried out for 1 minute at a temperature of 23° C. using isopropyl alcohol as a resist developer. Thereafter, the developer was removed by nitrogen blowing. Note that the electron beam irradiation dose was varied in a range of 4 µC/cm² to 200 µC/cm² in increments of 4 µC/cm². Next, an optical film thickness measurement tool (Lambda Ace produced by SCREEN Semiconductor Solutions Co., Ltd.) was used to measure the thickness of the resist film in regions in which writing had been performed. A sensitivity curve was prepared that indicated a relationship between the common logarithm of the total electron beam irradiation dose and the remaining film fraction of the resist film after development (=thickness of resist film after development/thickness of resist film formed on silicon wafer).

The obtained sensitivity curve (horizontal axis: common logarithm of total electron beam irradiation dose; vertical axis: remaining film fraction of resist film (0≤remaining film fraction≤1.00)) was fitted to a quadratic function in a range from a remaining film fraction of 0.20 to a remaining film fraction of 0.80, and a straight line that joined points on the obtained quadratic function (function of remaining film fraction and common logarithm of total irradiation dose) corresponding to remaining film fractions of 0 and 0.50 (linear approximation for gradient of sensitivity curve) was prepared. In addition, the total electron beam irradiation dose $E_{th}$ (µC/cm²) was determined for when the remaining film fraction on the obtained straight line (function of remaining film fraction and common logarithm of total irradiation dose) was 0. A smaller value for $E_{th}$ indicates higher sensitivity and that scission of the copolymer serving as a positive resist can occur well at a smaller irradiation dose.

In addition, the γ value was determined by the formula shown below. In the following formula, $E_0$ is the logarithm of the total irradiation dose obtained when the sensitivity curve is fitted to a quadratic function in a range from a remaining film fraction of 0.20 to a remaining film fraction of 0.80, and then a remaining film fraction of 0 is substituted with respect to the obtained quadratic function (function of remaining film fraction and common logarithm of total irradiation dose). Also, Ei is the logarithm of the total irradiation dose obtained when a straight line is prepared that joins points on the obtained quadratic function corresponding to remaining film fractions of 0 and 0.50 (linear approximation for gradient of sensitivity curve), and then a remaining film fraction of 1.00 is substituted with respect to the obtained straight line (function of remaining film fraction and common logarithm of total irradiation dose). The following formula expresses the gradient of the straight line between a remaining film fraction of 0 and a remaining film fraction of 1.00. A larger γ value indicates that the sensitivity curve has a larger gradient and that a clear pattern can be better formed.

$$\gamma = \left| \log_{10}\left(\frac{E_1}{E_0}\right) \right|^{-1}$$

<Remaining Film Fraction>
[Remaining Film Fraction (Irradiation Dose: $0.80E_{th}$ and $0.90E_{Th}$)]

The electron beam irradiation doses that varied in a range of 4 µC/cm² to 200 µC/cm² in increments of 4 µC/cm² in preparation of the sensitivity curve in the "Sensitivity and γ value" section (i.e., irradiation doses of 4, 8, 12, 16 . . . 196, and 200 µC/cm²) were each divided by $E_{th}$ determined as described above.

In a case in which there was an electron beam irradiation dose for which the resultant value (electron beam irradiation dose/$E_{th}$) was 0.80, the remaining film fraction at that electron beam irradiation dose was taken to be a remaining film fraction ($0.80E_{th}$).

In a case in which there was not an electron beam irradiation dose for which the resultant value (electron beam irradiation dose/$E_{th}$) was 0.80, the two values closest to 0.80 among these values were identified, and the electron beam irradiation doses for these two points were taken to be P (µC/cm²) and P+4 (µC/cm²), respectively. A remaining film fraction ($0.80E_{th}$) was then determined by the following formula.

Remaining film fraction $(0.80E_{th})=S-\{(S-T)/(V-U)\}\times(0.80-U)$

In this formula:
S represents the remaining film fraction at the electron beam irradiation dose P;
T represents the remaining film fraction at the electron beam irradiation dose P+4;
U represents P/$E_{th}$; and
V represents (P+4)/$E_{th}$.

A remaining film fraction ($0.90E_{th}$) at an electron beam irradiation dose for which the resultant value (electron beam irradiation dose/$E_{th}$) was 0.90 was determined in the same manner.

Higher values for the calculated remaining film fractions indicate that the resist film is more resistant to dissolving in a developer at irradiation doses lower than a total electron beam irradiation dose that enables a remaining film fraction of roughly 0. In other words, this indicates that the resist film has low solubility in the developer in a surrounding region of a pattern formation region of the resist film, which is a region having a comparatively low irradiation dose. Accordingly, high remaining film fractions calculated as described above indicate that there is a clear boundary between a region where the resist film is to be dissolved to form a pattern and a region where the resist film is to remain without dissolving, and thus indicate high pattern clarity.

Moreover, when the remaining film fractions described above are high, this indicates that the resist is not easily influenced by irradiation noise in a non-irradiated region and that the resolution of an obtained resist pattern can be sufficiently increased.

[Remaining Film Fraction (Half Pitch (Hp): 25 nm)]

A spin coater (MS-A150 produced by Mikasa Co., Ltd.) was used to apply a positive resist composition onto a silicon wafer of 4 inches in diameter such as to have a thickness of 50 nm. The applied positive resist composition was heated for 5 minutes by a hot plate having a temperature of 160° C. to form a positive resist film on the silicon wafer. An electron beam lithography tool (ELS-S50 produced by Elionix Inc.) was used to perform electron beam writing of a 1:1 line-and-space pattern having a line width of 25 nm (i.e., having a half pitch of 25 nm) with an optimal exposure dose ($E_{op}$) so as to obtain an electron beam-written wafer. Note that the optimal exposure dose was set as appropriate with a value approximately double $E_{th}$ as a rough guide.

The electron beam-written wafer was subjected to development treatment through 1 minute of immersion in isopropyl alcohol as a resist developer at 23° C. Thereafter, the developer was removed by nitrogen blowing to form a line-and-space pattern (half pitch: 25 nm). A pattern section was then cleaved and was observed at ×100,000 magnification using a scanning electron microscope (JMS-7800F PRIME produced by JEOL Ltd.) in order to measure the maximum height ($T_{max}$) of the resist pattern after development and the initial thickness $T_0$ of the resist film. The remaining film fraction for a half pitch (hp) of 25 nm was determined by the following formula. A higher remaining film fraction (half pitch (hp): 25 nm) indicates less resist pattern top loss.

Remaining film fraction (%)=$(T_{max}/T_0)\times100$

<Resist Pattern Formability>

A resist composition (copolymer concentration: 1.7 mass %) produced in each example or comparative example was used to form a resist film of 50 nm in thickness on a 3-inch silicon wafer using a spin coater (MS-A150 produced by Mikasa Co., Ltd.) and with 5 minutes of heating of the positive resist composition on a hot plate having a temperature of 160° C. The resist film was then exposed with an accelerating voltage of 50 kV and an electron beam irradiation dose of 100 µC/cm² to 250 µC/cm² using an electron beam lithography tool (ELS-S50 produced by Elionix Inc.) so as to write a contact hole pattern with a diameter of 25 nm as a perfect circle and a pitch of 50 nm in a range of 0.5 µm×0.5 µm. Thereafter, 1 minute of development treatment was performed at a temperature of 23° C. using isopropyl alcohol as a resist developer, and then the developer was removed by nitrogen blowing. The formed resist pattern was observed (magnification: ×100,000) using a scanning electron microscope (SEM) in order to visually check contact hole formability.

Specifically, after visually confirming whether or not a resist pattern had been formed as a whole for a given electron beam irradiation dose without regard to quality of the formed resist pattern, sections where contact holes were connected to each other were counted as defects, and an evaluation was made in accordance with the following standard. A smaller number of defects indicates better resist pattern formability.

A: Fewer than 10 defects
B: Not fewer than 10 and fewer than 100 defects
C: 100 or more defects <Dry Etching Resistance>

A spin coater (MS-A150 produced by Mikasa Co., Ltd.) was used to apply a positive resist composition onto a silicon wafer of 4 inches in diameter such as to have a thickness of 500 nm. The applied positive resist composition was heated for 5 minutes by a hot plate having a temperature of 160° C. to form a resist film on the silicon wafer.

Next, the resist film was subjected to etching (type of gas: CF 4; flow rate: 100 sccm; pressure: 10 Pa; power consumption: 200 W; time: 3 mins) using a plasma etching apparatus (EXAM produced by Shinko Seiki Co., Ltd.). Thereafter, the thickness of the remaining film (remaining film thickness) was measured by a step height/surface roughness/fine shape profilometer (P6 produced by KLA Tencor). This was used to determine the etching thickness (=initial resist film thickness−remaining film thickness) and to calculate the etching rate (units: nm/min). A smaller etching rate indicates better dry etching resistance.

Example 1

<Production of Copolymer>
[Production of 18% Solid Content Aqueous Solution of Partially Hydrogenated Tallow Fatty Acid Potassium Soap]

After preparing 100 g of deionized water and then heating this deionized water to 70° C. under stirring, 8.40 g of potassium hydroxide (49% aqueous solution) was added thereto. Next, 19.6 g of HARDENED TALLOW FATTY ACID 45° HFA (produced by NOF Corporation) was added at an addition rate of 1.28 g/min, and then 0.126 g of potassium silicate was added. At least 2 hours of stirring was performed at 80° C. to yield an 18% solid content aqueous solution of partially hydrogenated tallow fatty acid potassium soap.

[Synthesis of Polymerized Product]

A glass ampoule in which a stirrer had been placed was charged with 3.00 g of 1-phenyl-1-trifluoromethyl-2,2,2-trifluoroethyl a-chloroacrylate (following formula) as a monomer (a), 2.712 g of a-methylstyrene as a monomer (b), and 0.0011 g of potassium persulfate as a polymerization initiator. In addition, an aqueous solution obtained by adding 6.771 g of deionized water and 0.0047 g of sodium carbonate to 0.5463 g of the 18% solid content aqueous solution of partially hydrogenated tallow fatty acid potassium soap produced as described above was added into the same ampoule to obtain a monomer composition, and then the ampoule was tightly sealed and oxygen was removed from the system through 10 repetitions of pressurization and depressurization with nitrogen gas.

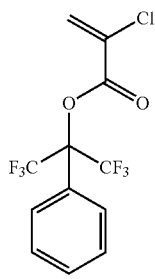 [SMILES: C=C(Cl)C(=O)OC(c1ccccc1)(C(F)(F)F)C(F)(F)F]

The system was then heated to 40° C. and a polymerization reaction was carried out for 6 hours. Next, 10 g of tetrahydrofuran was added to the system and then the resultant solution was dripped into 300 mL of methanol to cause precipitation of a polymerized product. Thereafter, the polymerized product that had precipitated was collected by filtration. Note that the obtained polymerized product was a copolymer comprising 50 mol % of α-methylstyrene units and 50 mol % of 1-phenyl-1-trifluoromethyl-2,2,2-trifluoroethyl chloroacrylate units. Various attributes of the obtained copolymer were measured. The results are shown in Table 1.

<Production of Positive Resist Compositions>

The obtained copolymer was dissolved in isoamyl acetate as a solvent to produce resist solutions (positive resist compositions) having copolymer concentrations of 8 mass % and 1.7 mass %.

The positive resist composition formed of a resist solution having a copolymer concentration of 8 mass % was used to evaluate the sensitivity and γ value of the copolymer. The positive resist composition formed of a resist solution having a copolymer concentration of 1.7 mass % was used to evaluate resist pattern formability. The results are shown in Table 1.

Examples 2 to 5

A copolymer and positive resist compositions were produced in the same way as in Example 1 with the exception that in production of the copolymer, the copolymer was obtained by purifying the polymerized product as described below. Various measurements and evaluations were performed in the same way as in Example 1. The results are shown in Table 1.

[Purification of Polymerized Product]

The polymerized product that had been collected by filtration was dissolved in 10 g of tetrahydrofuran (THF) and then the resultant solution was dripped into 100 g of a mixed solvent of THF and methanol (MeOH) to cause precipitation of a white coagulated material (copolymer comprising α-methylstyrene units and 1-phenyl-1-trifluoromethyl-2,2,2-trifluoroethyl α-chloroacrylate units). Thereafter, the solution containing the precipitated copolymer was filtered using a Kiriyama funnel to obtain a white copolymer (copolymer comprising 50 mol % of α-methylstyrene units and 50 mol % of 1-phenyl-1-trifluoromethyl-2,2,2-trifluoroethyl α-chloroacrylate units). Note that the chemical composition (THF:MeOH (mass ratio)) of the mixed solvent used in each example was 33:67 (Example 2), 34:66 (Example 3), 35:65 (Example 4), or 36:64 (Example 5). Various attributes of the obtained copolymer were measured. The results are shown in Table 1.

Note that the obtained copolymer comprised 50 mol % of a-methylstyrene units and 50 mol % of 1-phenyl-1-trifluoromethyl-2,2,2-trifluoroethyl α-chloroacrylate units.

Example 6

A polymerized product was obtained in the same way as in Example 1 with the exception that in synthesis of the polymerized product, potassium persulfate serving as a polymerization initiator was not compounded in the monomer composition, and the polymerization reaction time was changed to 11 hours. Note that the obtained polymerized product was a copolymer comprising 50 mol % of a-methylstyrene units and 50 mol % of 1-phenyl-1-trifluoromethyl-2,2,2-trifluoroethyl α-chloroacrylate units. Various attributes of the obtained copolymer were measured. The results are shown in Table 1.

Moreover, positive resist compositions were produced in the same way as in Example 1 using the obtained copolymer, and various evaluations were performed in the same way as in Example 1. The results are shown in Table 1.

Examples 7 to 12

A copolymer and positive resist compositions were produced in the same way as in Example 6 with the exception that in production of the copolymer, the copolymer was obtained by purifying the polymerized product as described below. Various measurements and evaluations were performed in the same way as in Example 1. The results are shown in Table 1.

[Purification of Polymerized Product]

The polymerized product that had been collected by filtration was dissolved in 10 g of tetrahydrofuran (THF) and then the resultant solution was dripped into 100 g of a mixed solvent of THF and methanol (MeOH) to cause precipitation of a white coagulated material (copolymer comprising α-methylstyrene units and 1-phenyl-1-trifluoromethyl-2,2,2-trifluoroethyl α-chloroacrylate units).

Thereafter, the solution containing the precipitated copolymer was filtered using a Kiriyama funnel to obtain a white copolymer (copolymer comprising 50 mol % of α-methylstyrene units and 50 mol % of 1-phenyl-1-trifluoromethyl-2,2,2-trifluoroethyl α-chloroacrylate units). Note that the chemical composition (THF:MeOH (mass ratio)) of the mixed solvent used in each example was 32:68 (Example 7), 33:67 (Example 8), 34:66 (Example 9), 35:65 (Example 10), 36:64 (Example 11), or 37:63 (Example 12). Various attributes of the obtained copolymer were measured. The results are shown in Table 1.

Note that the obtained copolymer comprised 50 mol % of a-methylstyrene units and 50 mol % of 1-phenyl-1-trifluoromethyl-2,2,2-trifluoroethyl α-chloroacrylate units.

Example 13

A copolymer and positive resist compositions were produced in the same way as in Example 8 (i.e., with a polymerization reaction time of 11 hours and with a chemical composition of THF:MeOH (mass ratio)=33:67 for the mixed solvent used in purification) with the exception that in synthesis of the polymer, 3.034 g of 4-isopropenyltoluene (following formula) was used as a monomer (b). Various measurements and evaluations were performed in the same way as in Example 1. The results are shown in Table 1. Note that the obtained copolymer comprised 50 mol % of 4-isopropenyltoluene units and 50 mol % of 1-phenyl-1-trifluoromethyl-2,2,2-trifluoroethyl a-chloroacrylate units.

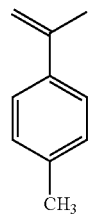

Example 14

Various measurements and evaluations were performed in the same way as in Example 9 (i.e., with a polymerization reaction time of 11 hours and with a chemical composition of THF:MeOH (mass ratio)=34:66 for the mixed solvent used in purification) with the exception that in synthesis of the polymer, 3.502 g of 4-chloro-a-methylstyrene (following formula) was used as a monomer (b). The results are shown in Table 1. Note that the obtained copolymer comprised 50 mol % of 4-chloro-α-methylstyrene units and 50 mol % of 1-phenyl-1-trifluoromethyl-2,2,2-trifluoroethyl α-chloroacrylate units.

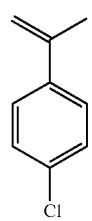

Comparative Example 1

Positive resist compositions were produced in the same way as in Example 1 with the exception that a copolymer produced as described below was used. Various measurements and evaluations were performed in the same way as in Example 1. The results are shown in Table 1.
<Production of Copolymer>
[Synthesis of Polymerized Product]

A glass ampoule in which a stirrer had been placed was charged with 3.00 g of 1-phenyl-1-trifluoromethyl-2,2,2-trifluoroethyl a-chloroacrylate as a monomer (a), 2.493 g of α-methylstyrene as a monomer (b), and 0.0039534 g of azobisisobutyronitrile as a polymerization initiator and was tightly sealed. Oxygen was removed from the system through 10 repetitions of pressurization and depressurization with nitrogen gas.

The system was then heated to 78° C. and a reaction was carried out for 3.5 hours. Next, 10 g of tetrahydrofuran was added to the system and then the resultant solution was dripped into 300 mL of methanol to cause precipitation of a polymerized product. Thereafter, the polymerized product that had precipitated was collected by filtration. Various attributes of the obtained copolymer were measured. The results are shown in Table 1.

Note that the obtained copolymer comprised 50 mol % of a-methylstyrene units and 50 mol % of 1-phenyl-1-trifluoromethyl-2,2,2-trifluoroethyl α-chloroacrylate units.

Comparative Example 2

A copolymer and positive resist compositions were produced in the same way as in Comparative Example 1 with the exception that in production of the copolymer, the copolymer was obtained by purifying the polymerized product as described below. Various measurements and evaluations were performed in the same way as in Example 1. The results are shown in Table 1.
[Purification of Polymerized Product]

A polymerized product obtained in the same way as in Comparative Example 1 was dissolved in 100 g of tetrahydrofuran (THF) and then the resultant solution was dripped into a mixed solvent of 250 g of THF and 750 g of methanol (MeOH) to cause precipitation of a white coagulated material (copolymer comprising α-methylstyrene units and 1-phenyl-1-trifluoromethyl-2,2,2-trifluoroethyl a-chloroacrylate units). Thereafter, the solution containing the polymer that had precipitated was filtered using a Kiriyama funnel to obtain a white copolymer. Note that the obtained copolymer comprised 50 mol % of α-methylstyrene units and 50 mol % of 1-phenyl-1-trifluoromethyl-2,2,2-trifluoroethyl α-chloroacrylate units.

Comparative Example 3

<Synthesis of Polymer>

A separable flask was charged with 0.5463 g of an 18% solid content aqueous solution of partially hydrogenated tallow fatty acid potassium soap produced in the same way as in Example 1 and 6.771 g of deionized water, and dissolution thereof was achieved. Next, 3 g of methyl α-chloroacrylate and 7.227 g of α-methylstyrene were added as monomers, and emulsification was performed under vigorous stirring. After performing nitrogen purging of the inside of the flask, 0.0027 g of sodium dithionite, 0.001 g of ethylenediaminetetraacetic acid iron sodium salt trihydrate, 0.0025 g of ethylenediaminetetraacetic acid tetrasodium salt tetrahydrate, 0.0015 g of sodium formaldehyde sulfoxylate, and 0.00524 g of cumene hydroperoxylate were added into the flask in order, and then 48 hours of stirring was performed at 5° C. Dropwise addition of 100 g of methanol to the reaction liquid was performed, and then solid content that precipitated was filtered off. The obtained solid content was dried to yield a copolymer comprising α-methylstyrene units and methyl a-chloroacrylate units. Various attributes of the obtained copolymer were measured. The results are shown in Table 1. Note that the copolymer comprised 47 mol % of α-methylstyrene units and 53 mol % of methyl α-chloroacrylate units.

<Production of Positive Resist Compositions>

The obtained copolymer was dissolved in anisole as a solvent to produce resist solutions (positive resist compositions) having copolymer concentrations of 8 mass % and 1.7 mass %.

The positive resist composition formed of a resist solution having a copolymer concentration of 8 mass % was used to evaluate the sensitivity and γ value of the copolymer. The positive resist composition formed of a resist solution having a copolymer concentration of 1.7 mass % was used to evaluate resist pattern formability. The results are shown in Table 1.

Note that a developer formed of hexyl acetate (N60 produced by Zeon Corporation) was used as a developer in the various evaluations. Also note that the operation of developer removal by nitrogen blowing after development treatment in each evaluation was changed to 10 seconds of rinsing using isopropyl alcohol.

TABLE 1

| | Copolymer | | | | | | | | |
|---|---|---|---|---|---|---|---|---|---|
| | Weight-average molecular weight Mw [−] | Number-average molecular weight Mn [−] | Molecular weight distribution Mw/Mn [−] | Proportion of components having molecular weight of less than 50,000 [%] | Proportion of components having molecular weight of less than 100,000 [%] | Proportion of components having molecular weight of more than 500,000 [%] | $Mw^{20}$ after 20 µC/cm² irradiation [−] | $Mw^{40}$ after 40 µC/cm² irradiation [−] | Molecular weight difference $(Mw^{20} - Mw^{40})$ [−] |
| Example 1 | 284160 | 127158 | 2.235 | 9.286 | 23.338 | 11.880 | 36545 | 20605 | 15940 |
| Example 2 | 349657 | 216858 | 1.612 | 2.139 | 8.456 | 16.548 | 38273 | 21373 | 16900 |
| Example 3 | 369591 | 228831 | 1.615 | 2.354 | 7.721 | 19.147 | 38735 | 21578 | 17157 |
| Example 4 | 395131 | 243665 | 1.622 | 2.118 | 6.999 | 22.046 | 39292 | 21826 | 17466 |
| Example 5 | 462351 | 252329 | 1.832 | 1.156 | 5.713 | 37.581 | 40602 | 22408 | 18194 |
| Example 6 | 235343 | 84269 | 2.793 | 11.973 | 27.172 | 15.092 | 34974 | 19906 | 15068 |
| Example 7 | 391884 | 230692 | 1.699 | 0.000 | 6.237 | 28.976 | 39224 | 21795 | 17428 |
| Example 8 | 417738 | 246375 | 1.696 | 0.000 | 3.755 | 27.829 | 39756 | 22032 | 17724 |
| Example 9 | 443946 | 266437 | 1.666 | 0.372 | 3.654 | 31.099 | 40263 | 22258 | 18006 |
| Example 10 | 481316 | 287802 | 1.672 | 0.292 | 2.983 | 34.768 | 40937 | 22557 | 18380 |
| Example 11 | 586550 | 335892 | 1.746 | 0.000 | 1.085 | 52.853 | 42585 | 23290 | 19295 |
| Example 12 | 676273 | 337174 | 2.006 | 0.000 | 0.351 | 61.293 | 43771 | 23817 | 19954 |
| Example 13 | 412509 | 225278 | 1.831 | 2.370 | 7.566 | 30.311 | 39651 | 21985 | 17666 |
| Example 14 | 446460 | 243291 | 1.835 | 0.541 | 4.222 | 34.706 | 40310 | 22278 | 18032 |
| Comparative Example 1 | 58166 | 31799 | 1.829 | 51.538 | 85.351 | 0.027 | 23325 | 14728 | 8597 |
| Comparative Example 2 | 69843 | 47563 | 1.468 | 39.141 | 78.416 | 0.226 | 24850 | 15405 | 9444 |
| Comparative Example 3 | 288503 | 105332 | 2.739 | 2.742 | 12.176 | 22.175 | 26699 | 14668 | 12031 |

| | Copolymer | | | | | | Resist film | | | |
|---|---|---|---|---|---|---|---|---|---|---|
| | Metal content [ppb] | | | Rinsing liquid | Sensitivity $E_{th}$ [µC/cm²] | γ value [−] | Remaining film fraction | | Half pitch 25 nm [%] | Resist pattern formability Defect evaluation | Dry etching resistance Etching rate [nm/min] |
| | K | Na | Developer | | | | $0.80E_{th}$ [−] | $0.90E_{th}$ [−] | | | |
| Example 1 | 225 | 710 | IPA | — | 86.43 | 36.43 | 0.9332 | 0.8843 | 93.3 | B | 85.56 |
| Example 2 | 18 | 5 | IPA | — | 88.92 | 36.99 | 0.9412 | 0.8921 | 96.2 | A | 85.43 |
| Example 3 | 18 | 5 | IPA | — | 89.41 | 38.14 | 0.9467 | 0.8945 | 96.5 | A | 82.85 |
| Example 4 | 18 | 5 | IPA | — | 89.78 | 38.30 | 0.9493 | 0.8982 | 96.9 | A | 82.51 |
| Example 5 | 18 | 5 | IPA | — | 89.97 | 38.38 | 0.9503 | 0.9001 | 97.1 | A | 82.33 |
| Example 6 | 62 | 4 | IPA | — | 85.43 | 35.21 | 0.9301 | 0.8898 | 92.1 | B | 89.75 |
| Example 7 | 2 | 2 | IPA | — | 90.19 | 38.47 | 0.9543 | 0.9023 | 97.3 | A | 82.13 |
| Example 8 | 2 | 2 | IPA | — | 90.52 | 38.62 | 0.9567 | 0.9056 | 97.7 | A | 81.83 |
| Example 9 | 2 | 2 | IPA | — | 90.81 | 38.74 | 0.9589 | 0.9085 | 98.0 | A | 81.57 |
| Example 10 | 2 | 2 | IPA | — | 90.98 | 38.81 | 0.9601 | 0.9102 | 98.2 | A | 81.42 |
| Example 11 | 2 | 2 | IPA | — | 91.07 | 38.85 | 0.9623 | 0.9111 | 98.3 | A | 81.34 |
| Example 12 | 2 | 2 | IPA | — | 90.88 | 37.54 | 0.9542 | 0.9092 | 98.1 | A | 80.56 |
| Example 13 | 2 | 2 | IPA | — | 88.54 | 37.43 | 0.9512 | 0.9011 | 97.2 | A | 84.43 |
| Example 14 | 2 | 2 | IPA | — | 90.34 | 36.45 | 0.9498 | 0.8982 | 96.9 | A | 86.70 |
| Comparative Example 1 | 35 | 7 | IPA | — | 76.54 | 28.91 | 0.8583 | 0.7653 | 82.0 | C | 108.29 |

TABLE 1-continued

| | | | | | | | | | | |
|---|---|---|---|---|---|---|---|---|---|---|
| Comparative Example 2 | 18 | 5 | IPA | — | 78.23 | 31.22 | 0.9111 | 0.8102 | 85.4 | B | 107.42 |
| Comparative Example 3 | 720 | 11550 | N60 | IPA | 90.28 | 8.81 | 0.7112 | 0.4120 | 79.4 | B | 95.60 |

It can be seen from Table 1 that it was possible to form a resist pattern having excellent dry etching resistance and clarity while also having few defects when using the copolymers of Examples 1 to 14 as compared to when using the copolymers of Comparative Examples 1 and 2, which had weight-average molecular weights of less than 230,000, and when using the copolymer of Comparative Example 3, which did not include the specific monomer unit (A).

INDUSTRIAL APPLICABILITY

Through the presently disclosed copolymer, it is possible to provide a main chain scission-type positive resist that is capable of forming a resist pattern having excellent dry etching resistance and clarity while also having few defects.

Moreover, through the presently disclosed positive resist composition and the presently disclosed method of forming a resist pattern using this positive resist composition, it is possible to form a resist pattern having excellent dry etching resistance and clarity while also having few defects.

The invention claimed is:

1. A copolymer comprising:
a monomer unit (A) represented by formula (I), shown below,

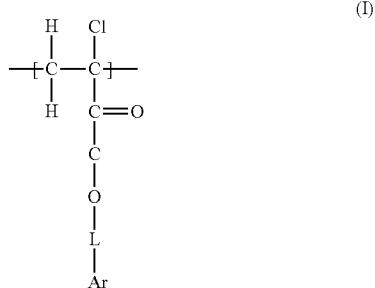

where, in formula (I), L is a single bond or a divalent linking group and Ar is an optionally substituted aromatic ring group; and
a monomer unit (B) represented by formula (II), shown below,

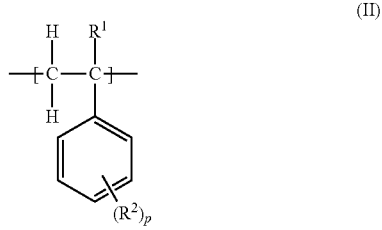

where, in formula (II), $R^1$ is an alkyl group, $R^2$ is hydrogen, an alkyl group, a halogen atom, a haloalkyl group, a hydroxy group, a carboxy group, or a halocarboxy group, p is an integer of not less than 0 and not more than 5, and in a case in which more than one $R^2$ is present, each $R^2$ may be the same or different, wherein
the copolymer has a weight-average molecular weight of 230,000 or more, and
a difference between weight-average molecular weight $Mw^{20}$ thereof upon exposure with an electron beam irradiation dose of 20 μC/cm$^2$ and weight-average molecular weight $Mw^{40}$ thereof upon exposure with an electron beam irradiation dose of 40 μC/cm$^2$ is 12,100 or more.

2. The copolymer according to claim 1, having a weight-average molecular weight of 280,000 or more.

3. The copolymer according to claim 1, wherein a proportion of components having a molecular weight of less than 50,000 is 20% or less.

4. The copolymer according to claim 1, wherein a proportion of components having a molecular weight of less than 100,000 is 30% or less.

5. The copolymer according to claim 1, wherein a proportion of components having a molecular weight of more than 500,000 is 10% or more.

6. The copolymer according to claim 1, wherein L is a divalent linking group that includes an electron withdrawing group.

7. The copolymer according to claim 6, wherein the electron withdrawing group is at least one selected from the group consisting of a fluorine atom, a fluoroalkyl group, a cyano group, and a nitro group.

8. A positive resist composition comprising: the copolymer according to claim 1; and a solvent.

9. A method of forming a resist pattern comprising:
a step (A) of forming a resist film using the positive resist composition according to claim 8;
a step (B) of exposing the resist film; and
a step (C) of developing the resist film that has been exposed using a developer.

10. The method of forming a resist pattern according to claim 9, wherein the developer includes an alcohol.

* * * * *